United States Patent [19]

Brunner

[11] Patent Number: 5,762,550

[45] Date of Patent: Jun. 9, 1998

[54] HEAT TRANSFER SYSTEM FOR ELECTRONIC ENCLOSURES

[75] Inventor: Robert D. Brunner, Los Gatos, Calif.

[73] Assignee: Toshiba America Information Systems, Inc., Irvine, Calif.

[21] Appl. No.: 697,234

[22] Filed: Aug. 21, 1996

[51] Int. Cl.⁶ ................................................ H05K 7/20
[52] U.S. Cl. ........................... 454/184; 361/695; 454/241
[58] Field of Search ........................... 454/184, 241, 454/243, 244, 249; 361/695

[56] References Cited

U.S. PATENT DOCUMENTS

| | | |
|---|---|---|
| 3,364,838 | 1/1968 | Bradley . |
| 4,557,095 | 12/1985 | Rice et al. ............... 454/184 X |
| 4,702,154 | 10/1987 | Dodson . |
| 4,744,005 | 5/1988 | Milani . |
| 4,907,645 | 3/1990 | Dumas et al. ............ 361/695 X |
| 5,107,398 | 4/1992 | Bailey . |
| 5,204,497 | 4/1993 | Herrick . |
| 5,208,730 | 5/1993 | Tracy . |
| 5,259,816 | 11/1993 | Ke et al. ................. 454/244 |
| 5,296,873 | 3/1994 | Russell et al. . |
| 5,375,038 | 12/1994 | Hardt . |
| 5,407,324 | 4/1995 | Starnes, Jr. et al. . |
| 5,432,674 | 7/1995 | Hardt . |
| 5,493,474 | 2/1996 | Schkrohowsky et al. . |

FOREIGN PATENT DOCUMENTS

| | | | |
|---|---|---|---|
| 56-119437 | 9/1981 | Japan ..................... | 454/249 |
| 61-186749 | 8/1986 | Japan ..................... | 454/249 |

*Primary Examiner*—Harold Joyce
*Attorney, Agent, or Firm*—Banner & Witcoff, Ltd.

[57] ABSTRACT

A housing for an electronic device having an air circulation device. The housing includes an enclosure with a plurality of panels. One of the panels includes an air inlet port and an air outlet port. The air inlet port and the air outlet port are spaced from each other. The air inlet port and the air outlet port have openings in the first panel and a plurality of generally parallel vanes located in respective opening to pull air into, or exhaust air from, the enclosure. The vanes of the air inlet port and the air outlet port are angled in opposite directions to minimize the recirculation of exhausted air back into the air inlet.

1 Claim, 3 Drawing Sheets

HEAT TRANSFER SYSTEM FOR ELECTRONIC ENCLOSURES

FIELD OF THE INVENTION

The present invention relates to the ventilation of electronic enclosures. More specifically, the present invention relates to air inlet and air outlet ports in the enclosure having oppositely directed vanes so that hot air exiting the enclosure is not recirculated back into the enclosure through the cool air inlet.

BACKGROUND OF THE INVENTION

A variety of references disclose air circulation systems with air inlet and outlet ports for cooling electronic components within an enclosure. In general, the air inlet and outlet ports are simply cutouts in the panels of the enclosure. Commonly, the cool air inlet port is located in the front or side panels of the enclosure, and the hot air outlet port is located in the back panel. However, sometimes other design considerations dictate the position of the electronic components within the enclosure, and the corresponding flow of the ventilating air. Thus, the location of the air inlet and outlet ports might not be optimally located. When this occurs, cross-circulation between the hot air exiting the enclosure and the cool air entering the enclosure might exist, i.e., the hot air exiting the enclosure might be drawn back into the enclosure through the cool air inlet port. This could result in overheating of the electronic components, degradation of performance, reduced life, or even component failures.

The problem of cross-circulation has been addressed in the prior art. For instance, U.S. Pat. No. 3,364,838 to Bradley discloses a cabinet for mounting, enclosing and cooling electrical apparatus. Bradley discloses an upper inlet opening and a lower exhaust opening in the same panel wherein the lower exhaust opening has vanes and the discharged air is directed by the downwardly sloping vanes down and along the floor for a sufficient distance to prevent recirculation to the front. Bradley also shows vanes, in FIG. 1, at the upper cool air inlet. However, these air inlet vanes are angled in the same direction as the lower hot air outlet vanes.

U.S. Pat. No. 5,107,398 to Bailey discloses a cooling system for electronic components mounted in a cabinet. The cooling system includes an air circulation device, an air inlet port, an air outlet port and a pressure conversion device or diffuser to reduce fan cooling inefficiencies. Bailey specifically discloses and claims an air directional member mounted in said air outlet to direct air passing through said air outlet away from said air inlet. Bailey also shows the cool air inlet port and the hot air outlet port in different panels, or sides, of the enclosure: the air inlet port is in the bottom horizontal surface of the enclosure, while the air outlet port is near the top of a vertical side wall. More importantly, only the hot air outlet port has vanes, directing the hot air up and away from the cool air inlet port.

The present invention overcomes the disadvantages of the prior art by providing an electronic enclosure with directional vanes in both the air inlet and outlet ports to reduce the amount of cross-circulation. In the present embodiment, the air inlet and outlet ports are located on the same side, or panel, of the electronic enclosure. Furthermore, due to other design considerations, the hot air outlet is located below the cool air inlet. Thus, without the present invention, the hot exhaust air would be drawn back into the cool air inlet and the operation of the electronic components would be compromised.

SUMMARY OF THE INVENTION

The purpose of this invention is to improve the convective heat transfer of an electronic enclosure by incorporating vanes in external air inlet and exhaust ports and orienting the direction of the vanes to optimize the convective heat transfer. Air is drawn into, and circulated through, the electronic enclosure by one or more fans in order to ventilate the enclosure and cool the electronic components. The system operates as follows: (1) cool air is drawn in through an upper inlet port in the enclosure's back panel, (2) warm air is exhausted through a lower outlet port in the back panel, and (3) the oppositely directed vanes in the upper inlet and lower outlet ports direct the exhausted warm air away from the cool air inlet. It should be noted that an alternate embodiment could have the cool air drawn in through an inlet port in the lower portion of the panel and the hot air exhausted through an outlet port in the upper portion of the panel.

In view of the foregoing, it is a principal object of the present invention to provide improved ventilation of an electronic enclosure by eliminating, or minimizing, cross-circulation between the hot exhaust air and the cool inlet air.

More, specifically, it is an object of the present invention to provide an electronic enclosure with air inlet and air outlet ports having vanes that are generally oppositely directed so that inlet air is drawn from a region remote from the region that exhaust air is directed towards.

It is another object of the invention to provide a housing for an electronic device having an air circulation device. The housing includes an enclosure with a plurality of panels. One of the panels includes an air inlet port and an air outlet port. The air inlet port and the air outlet port are spaced from each other. The air inlet port and the air outlet port have openings in the first panel and a plurality of generally parallel vanes located in respective opening to pull air into, or exhaust air from, the enclosure. The vanes of the air inlet port and the air outlet port are angled in opposite directions to minimize the recirculation of exhausted air back into the air inlet.

It is yet another object of the invention to provide a housing for an electronic device having an air circulation device, the housing having an enclosure, an air inlet port, and an air outlet port. The enclosure having a plurality of panels, one of the plurality of panels being a first panel. The air inlet port is located in the first panel of the enclosure. The air outlet port is located in the first panel of the enclosure. The air inlet port includes an inlet opening in the first panel and a plurality of generally parallel vanes located in the inlet opening to direct the air entering said enclosure in a first direction. The air outlet port includes an outlet opening in the first panel and a plurality of generally parallel vanes located in the outlet opening to direct the air leaving the enclosure in a second direction. The vanes of the air inlet port are angled 5° to 85° from the inlet port and the vanes of the air outlet port are angled −5° to −85° from the outlet port.

DETAILED DESCRIPTION OF THE INVENTION

Figure 1:
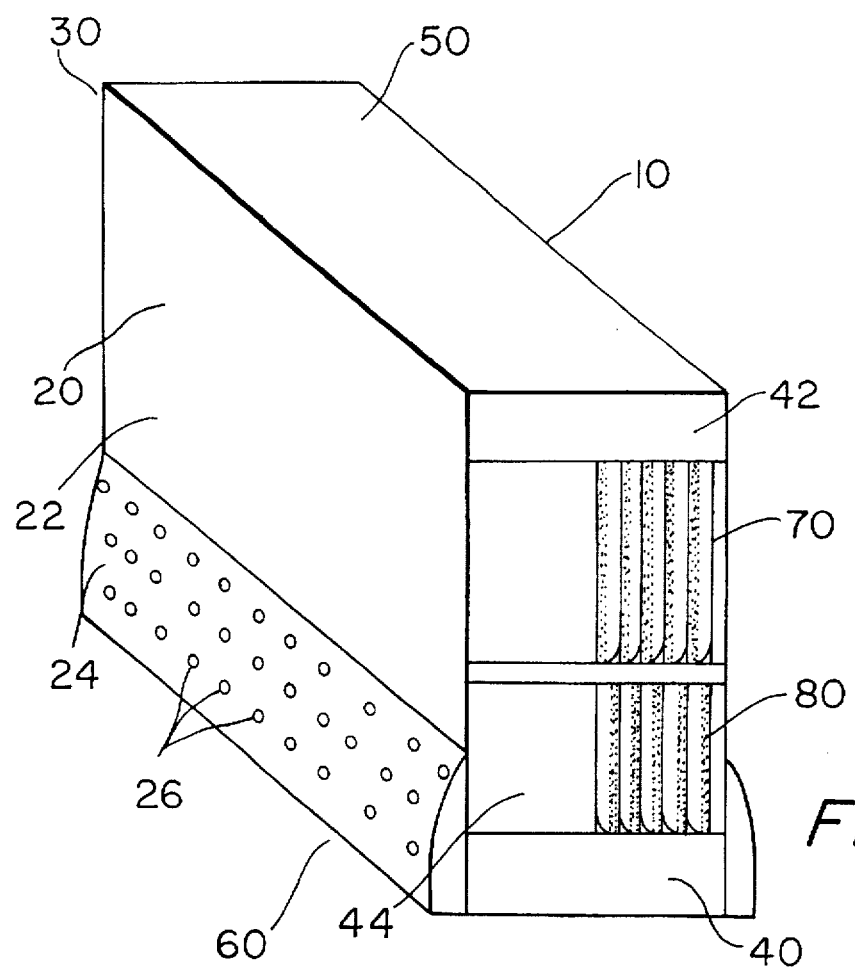
FIG. 1 is a perspective view of the present invention in its preferred embodiment configuration.

Referring to the figures, the electronic enclosure embodying the present invention is generally designated by reference numeral 10. As depicted in FIG. 1, electronic enclosure 10 generally consists of opposing side panels 20, a front panel 30, a back panel 40, a top panel 50, a bottom panel (not shown), an air inlet port 70, and air outlet port 80. In the embodiment shown in FIG. 1, many of the panels are shown as having multiple sections or regions. For instance, side panel 20 is illustrated as having two sections, a primary side section 22, and a side skirt 24. Back panel 40 is illustrated as having two sections, an upper back section 42, and a lower back section 44. It is recognized that the number of panels and/or the number of sections of each panel may be varied and need not be limited to specific embodiments disclosed. Furthermore, side skirt 24 is shown with multiple small holes 26, although, for the purposes of the present invention, side skirt 24 need not have holes. Additionally, in a preferred arrangement, the enclosure or housing 10 is comprised of a single injection molded piece which can be attached to a sheet metal chassis placed therein. However, other arrangements are evident to one of ordinary skill in the art.

Figure 2:
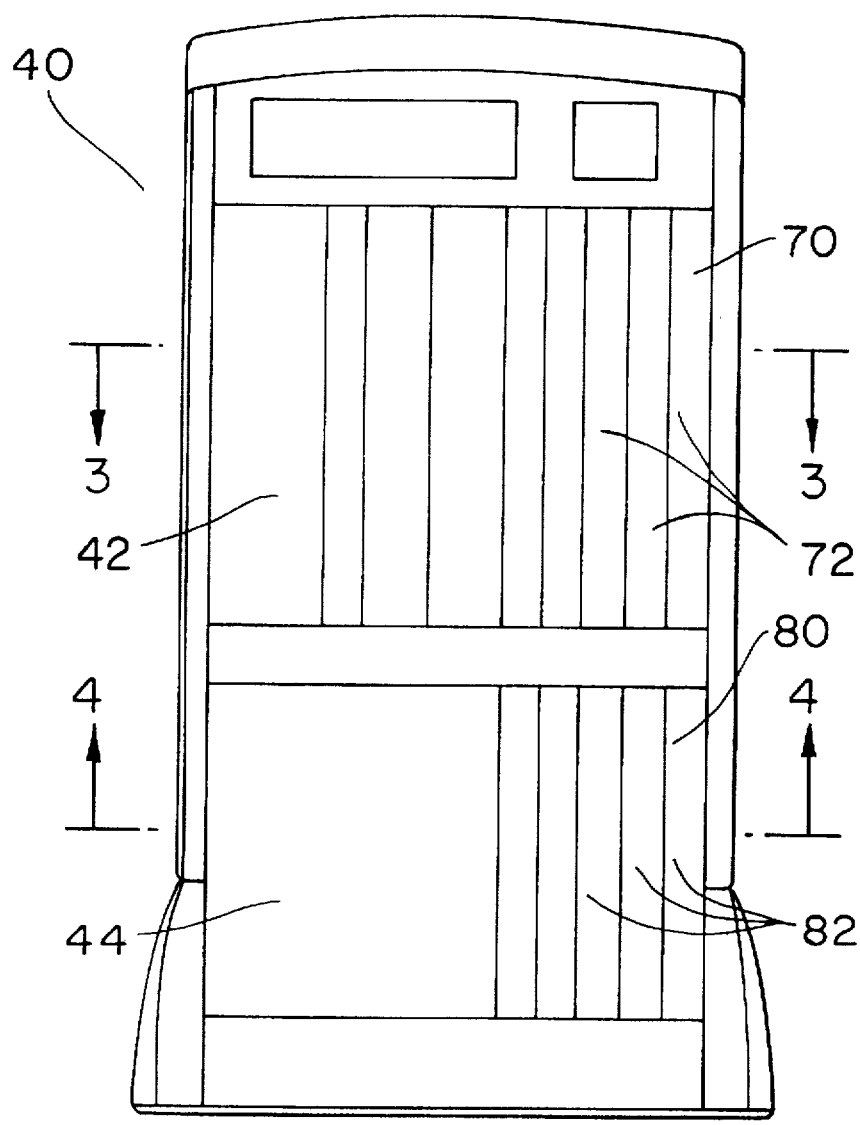
FIG. 2 is an elevation view of the back panel of the preferred configuration.

As shown in FIG. 2, back panel 40 of the preferred configuration has an air inlet port 70 and an air outlet port 80. In general, air inlet port 70 and air outlet port 80 need not be located in back panel 40 and may be located on another panel. As illustrated in FIG. 2, air inlet port 70 is located in the upper back section 42, above air outlet port 80 which is located in the lower back section 44. Air inlet port 70 is shown with a series of generally vertical and generally parallel air inlet vanes 72. Air outlet port is also shown with a series of generally vertical and generally parallel air outlet vanes 82. As discussed below, inlet vanes 72 and outlet vanes 82 need not be limited to a vertical orientation or a parallel configuration.

Figure 3:
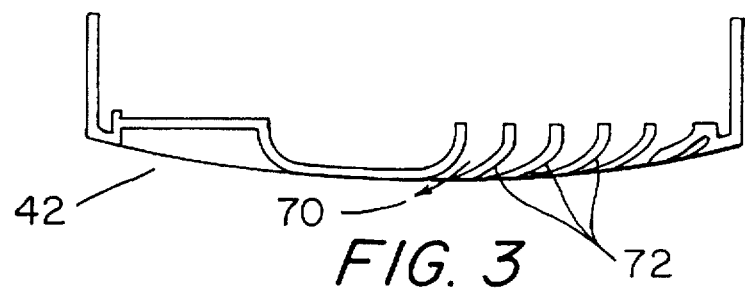
FIG. 3 is a cross-sectional view of the air inlet port in the back panel of the preferred configuration taken along line 3—3 of FIG. 2.
Figure 4:
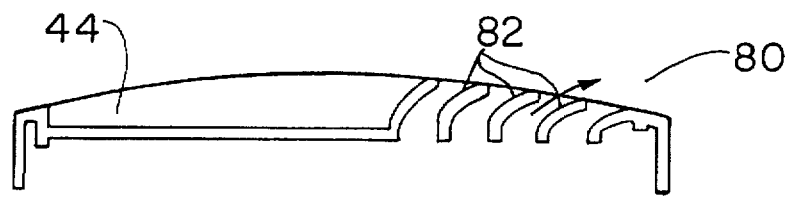
FIG. 4 is a cross-sectional view of the air outlet port in the back panel of the preferred configuration taken along line 4—4 of FIG. 2.

FIG. 3 is a cross-sectional view of air inlet vanes 72, and FIG. 4 is a cross-sectional view of air outlet vanes 82. Each vane preferably includes an arcuate cross-section, although, again, the vanes need not be limited to such a cross-sectional shape. It is recognized that inlet vanes 72 and outlet vanes 82 may flat and/or of constant cross-section.

FIGS. 2–4 illustrate the directional aspect of air inlet vanes 72 and air outlet vanes 82. In FIG. 2, looking at back panel 40, air inlet vanes 72 are angled so that air is drawn in from the left side of back panel 40. Air outlet vanes 82 are angled so that air is exhausted to the right side of back panel 40. Thus, the cross-circulation of the hot exhaust air out of air outlet port 80 and back into air inlet port 70 is minimized.

In a preferred embodiment, the vanes are oppositely angled from the ports and the front panel to direct the airflow 30° to 60° from the respective ports and front panel in opposite directions. However, the vanes may be oppositely angled from the ports and the front panel to direct the airflow 5° to 85° from the respective ports and front panel in opposite directions. The desired angle may depend upon various airflow and spacial requirements. Thus, in a particular application, 45° and −45° may be the desired inlet and outlet vane angles, whereas other angles may be preferred in other applications.

Thus, in operation, an air circulating device, not shown, inside the enclosure, causes air to enter the air inlet port 70. The air is used to cool electronic components inside the enclosure, and is exhausted out of the air outlet port 80. As the inlet vanes 72 are angled in a direction away from the front panel, the air will tend to be sucked in along that angle $A_i$. Similarly, as the outlet vanes 82 are angled in a direction away from the front panel, the air will tend to be exhausted out along that angle $A_o$. As the inlet angle $A_i$ and the outlet angle $A_o$ are in opposite directions, i.e., not towards one another, less mixing of the exhaust air and the inlet air will occur.

Figure 7:
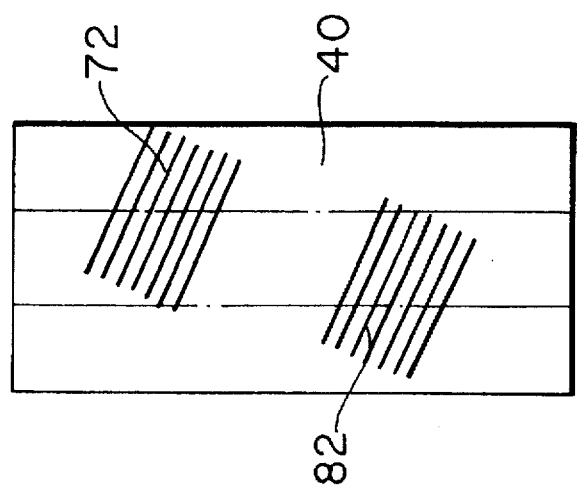
FIGS. 5–7 schematically illustrate alternative embodiments of the present invention.
Figure 6:
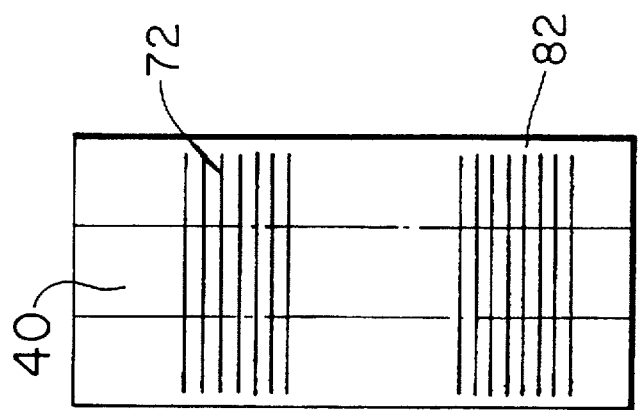
Figure 5:
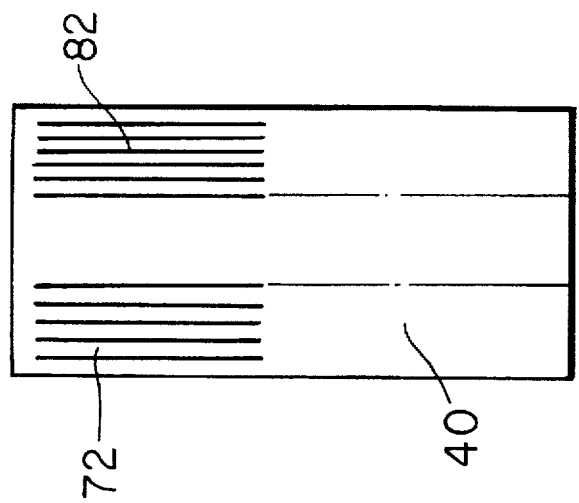

Alternative embodiments which direct the inlet air in a direction opposite to the outlet air are shown in FIGS. 5–7. As shown in FIG. 5, inlet vanes 72a and outlet vanes 82a could both be oriented vertically but the inlet and outlet ports could be positioned side-by-side. As shown in FIG. 6, inlet vanes 72b could be horizontal and directed upward, and outlet vanes 82b could also be horizontal, but directed downward. Further, as shown in FIG. 7, inlet vanes 72c and outlet vanes 82c could be oriented at an angle displaced from the vertical, as long as inlet vanes 72c are oppositely directed from outlet vanes 82c.

The disclosed embodiment is merely illustrative of the principles of the present invention, which could be implemented by variations in the structure which would be readily apparent to one skilled in the art. Accordingly, the scope of the present invention is to be determined in accordance with the appended claims.

What is claimed:

1. A housing for an electronic device having an air circulation device, said housing comprising:

an enclosure, said enclosure having a plurality of panels, one of said plurality of panels being a first panel;

an air inlet port, said air inlet port located in said first panel of the enclosure;

an air outlet port, said air outlet port located in said first panel of the enclosure and vertically spaced a distance from the inlet port;

said air inlet port including an inlet opening in said first panel and a plurality of generally parallel vertically-oriented longitudinal vanes located in said inlet opening to pull air into said enclosure, said vanes of said air inlet port angled laterally in a first direction away from said air inlet opening;

said air outlet port including an outlet opening in said first panel and a plurality of generally parallel vertically-oriented longitudinal vanes located in said outlet opening to direct the air leaving said enclosure, said vanes of said air outlet port angled laterally in a second direction away from said air outlet opening, said second direction being opposite said first direction;

said vanes of said air inlet port are oriented to pull inlet air form a first lateral region and the vanes of said air outlet port are oriented to discharge outlet air from a second lateral region;

wherein said vanes of said air inlet port are angled 30° to 60° from the inlet port, and said vanes of said air outlet port are angled −30° to −60° from the outlet port.

* * * * *